(12) United States Patent
Vanhoutte et al.

(10) Patent No.: US 7,557,298 B2
(45) Date of Patent: Jul. 7, 2009

(54) LAMINATED BUS BAR ASSEMBLY

(75) Inventors: Carl Vanhoutte, Deurne (BE); Jean-Pierre Roelandt, Lochristi (BE)

(73) Assignee: World Properties, Inc., Lincolnwood, IL (US)

( * ) Notice: Subject to any disclaimer, the term of this patent is extended or adjusted under 35 U.S.C. 154(b) by 0 days.

(21) Appl. No.: 10/269,223

(22) Filed: Oct. 14, 2002

(65) Prior Publication Data
US 2004/0069527 A1 Apr. 15, 2004

(51) Int. Cl.
H02G 3/04 (2006.01)
H02G 5/00 (2006.01)
(52) U.S. Cl. .................... 174/68.2; 174/149 B
(58) Field of Classification Search ............... 174/68.2, 174/70 B, 71 B, 88 B, 99 B, 129 B, 149 B, 174/256, 259; 361/306.3, 321.2, 611, 311, 361/312; 439/212; 428/209, 458, 461, 465; 29/829–840, 848–850, 842, 852, 882, 883, 29/868, 869, 855–858
See application file for complete search history.

(56) References Cited

U.S. PATENT DOCUMENTS

| | | | | |
|---|---|---|---|---|
| 3,126,240 A | * | 3/1964 | Christensen | 174/99 B |
| 3,401,230 A | * | 9/1968 | Giger, Jr. | 174/99 B |
| 3,439,309 A | * | 4/1969 | Giger, Jr. et al. | 174/68.2 |
| 3,459,880 A | * | 8/1969 | Erdle | 174/129 B |
| 3,476,871 A | | 11/1969 | Erdle | 174/88 |
| 3,488,621 A | * | 1/1970 | Stevens | 174/68.2 |
| 3,708,609 A | | 1/1973 | Iosue et al. | 174/72 B |
| 3,726,988 A | | 4/1973 | Davis | 174/68.2 |
| 3,732,523 A | * | 5/1973 | Fouse et al. | 174/71 B |
| 3,853,685 A | * | 12/1974 | Friedrich et al. | 428/305.5 |
| 3,883,784 A | * | 5/1975 | Peck et al. | 361/312 |
| 3,893,233 A | * | 7/1975 | Glover | 174/72 B |
| 4,102,722 A | | 7/1978 | Shoop | 156/99 |
| 4,133,101 A | | 1/1979 | Glover | 29/628 |
| 4,323,726 A | | 4/1982 | Criss et al. | 174/68.5 |
| 4,342,881 A | | 8/1982 | Fukuda et al. | 174/72 B |
| 4,346,133 A | * | 8/1982 | Hipchen et al. | 428/109 |
| 4,367,295 A | * | 1/1983 | von Bonin | 521/165 |
| 4,403,107 A | * | 9/1983 | Hoffman | 174/255 |
| 4,430,522 A | | 2/1984 | Bader | 174/72 B |
| 4,450,029 A | | 5/1984 | Holbert et al. | 156/250 |

(Continued)

FOREIGN PATENT DOCUMENTS

| | | | |
|---|---|---|---|
| CA | 959138 | 12/1974 | 337/30 |

(Continued)

OTHER PUBLICATIONS

English Abstract of JP2000149667.

(Continued)

*Primary Examiner*—Hung V Ngo
(74) *Attorney, Agent, or Firm*—Cantor Colburn LLP

(57) ABSTRACT

A laminated bus bar assembly comprises alternating layers of a conductive layer and a foam dielectric layer. The foam dielectric layer has a dielectric constant greater than a solid non-porous dielectric constant of the same material, the use of which increases the partial discharge inception and extinction voltage levels, provides vibration resistance, decreases inductance and the like. The bus bar assembly of laminar construction is useful for power distribution systems, high power transistor modules, and the like.

20 Claims, 2 Drawing Sheets

U.S. PATENT DOCUMENTS

| | | | | |
|---|---|---|---|---|
| 4,450,376 | A * | 5/1984 | Meitzler | 310/334 |
| 4,467,051 | A * | 8/1984 | Finaz et al. | 521/77 |
| 4,517,406 | A | 5/1985 | Erdle | 174/72 B |
| 4,663,098 | A * | 5/1987 | Gilliam et al. | 29/828 |
| 4,755,911 | A * | 7/1988 | Suzuki | 428/422 |
| 4,822,659 | A * | 4/1989 | Anderson et al. | 428/99 |
| 4,867,696 | A | 9/1989 | Demler, Jr. et al. | 439/212 |
| 4,985,106 | A * | 1/1991 | Nelson | 428/76 |
| 5,096,426 | A * | 3/1992 | Simpson et al. | 29/883 |
| 5,142,100 | A * | 8/1992 | Vaupotic | 29/857 |
| 5,365,424 | A | 11/1994 | Deam et al. | 363/144 |
| 5,541,366 | A * | 7/1996 | Maoz et al. | 174/258 |
| 5,576,710 | A * | 11/1996 | Broderick et al. | 342/1 |
| 5,579,217 | A | 11/1996 | Deam et al. | 363/144 |
| 5,625,369 | A | 4/1997 | Newman | 343/770 |
| 5,723,820 | A * | 3/1998 | Whitney et al. | 174/99 B |
| 5,724,012 | A * | 3/1998 | Teunisse | 333/238 |
| 5,733,639 | A * | 3/1998 | Gosselin | 428/209 |
| 5,734,354 | A * | 3/1998 | Twelves | 343/815 |
| 5,793,330 | A * | 8/1998 | Gans et al. | 343/700 MS |
| 5,798,064 | A * | 8/1998 | Peterson | 264/46.3 |
| 5,854,445 | A * | 12/1998 | Graham et al. | 174/99 B |
| 5,870,274 | A * | 2/1999 | Lucas | 361/311 |
| 6,033,370 | A * | 3/2000 | Reinbold et al. | 361/291 |
| 6,083,340 | A * | 7/2000 | Nomura et al. | 29/852 |
| 6,178,277 | B1 * | 1/2001 | Ravela et al. | 385/109 |
| 6,226,431 | B1 * | 5/2001 | Brown et al. | 385/114 |
| 6,244,876 | B1 | 6/2001 | Saka | 439/76.2 |
| 6,339,192 | B1 * | 1/2002 | Hashimoto | 174/72 B |
| 6,376,767 | B1 * | 4/2002 | Knudsen et al. | 174/47 |
| 6,472,668 | B1 * | 10/2002 | Griesmer et al. | 250/370.13 |
| 6,688,679 | B2 * | 2/2004 | Droulez | 296/208 |
| 6,703,114 | B1 * | 3/2004 | Guiles et al. | 428/209 |

FOREIGN PATENT DOCUMENTS

| | | | |
|---|---|---|---|
| CH | 537110 A | * | 5/1973 |
| DE | 2403135 A | * | 7/1975 |
| GB | 2 113 455 A | | 8/1983 |
| GB | 2 115 213 A | | 9/1983 |
| GB | 2 315 928 A | | 2/1998 |

OTHER PUBLICATIONS

English Abstract of JP2000215735.
English Abstract of JP2000294040.

* cited by examiner

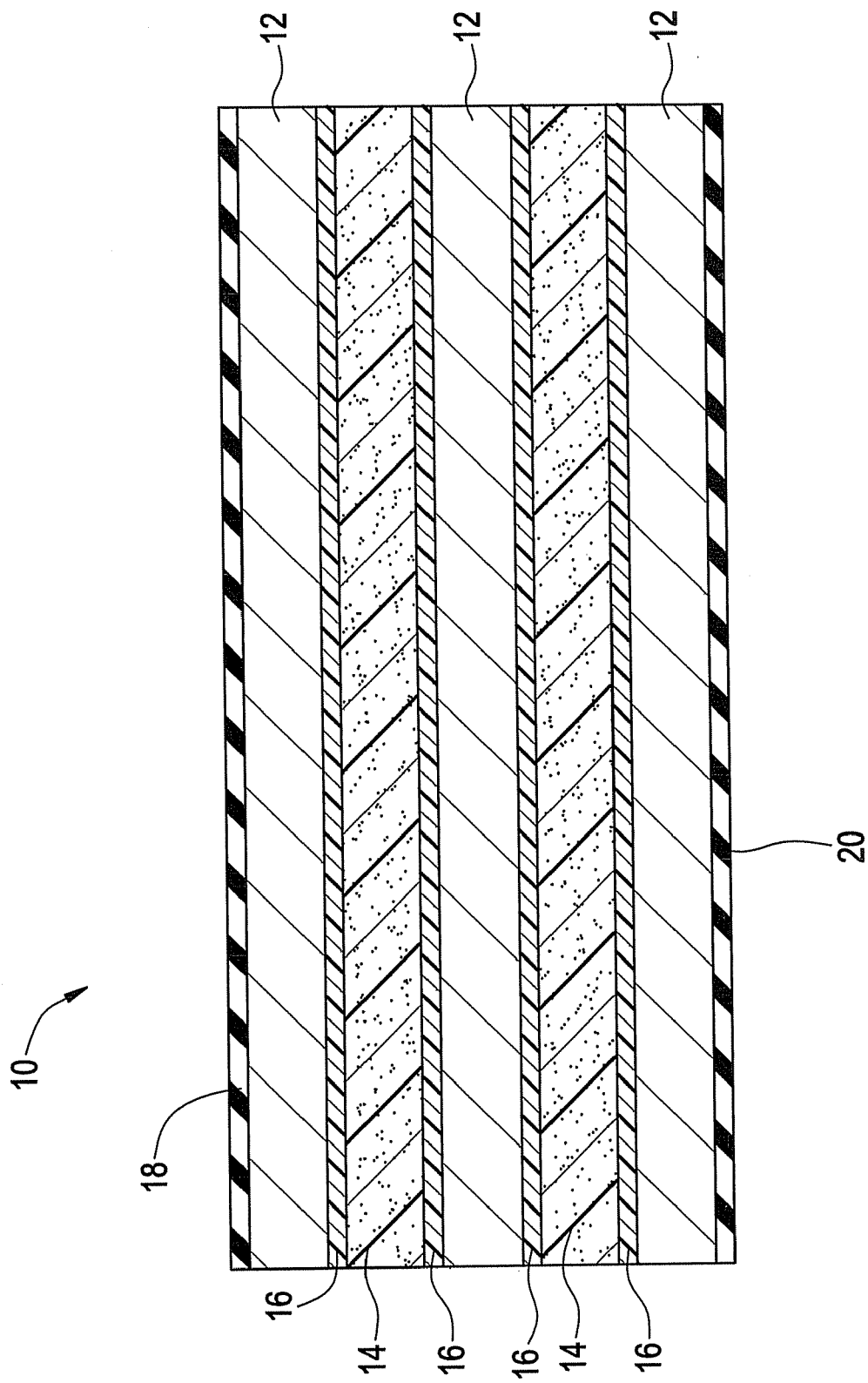

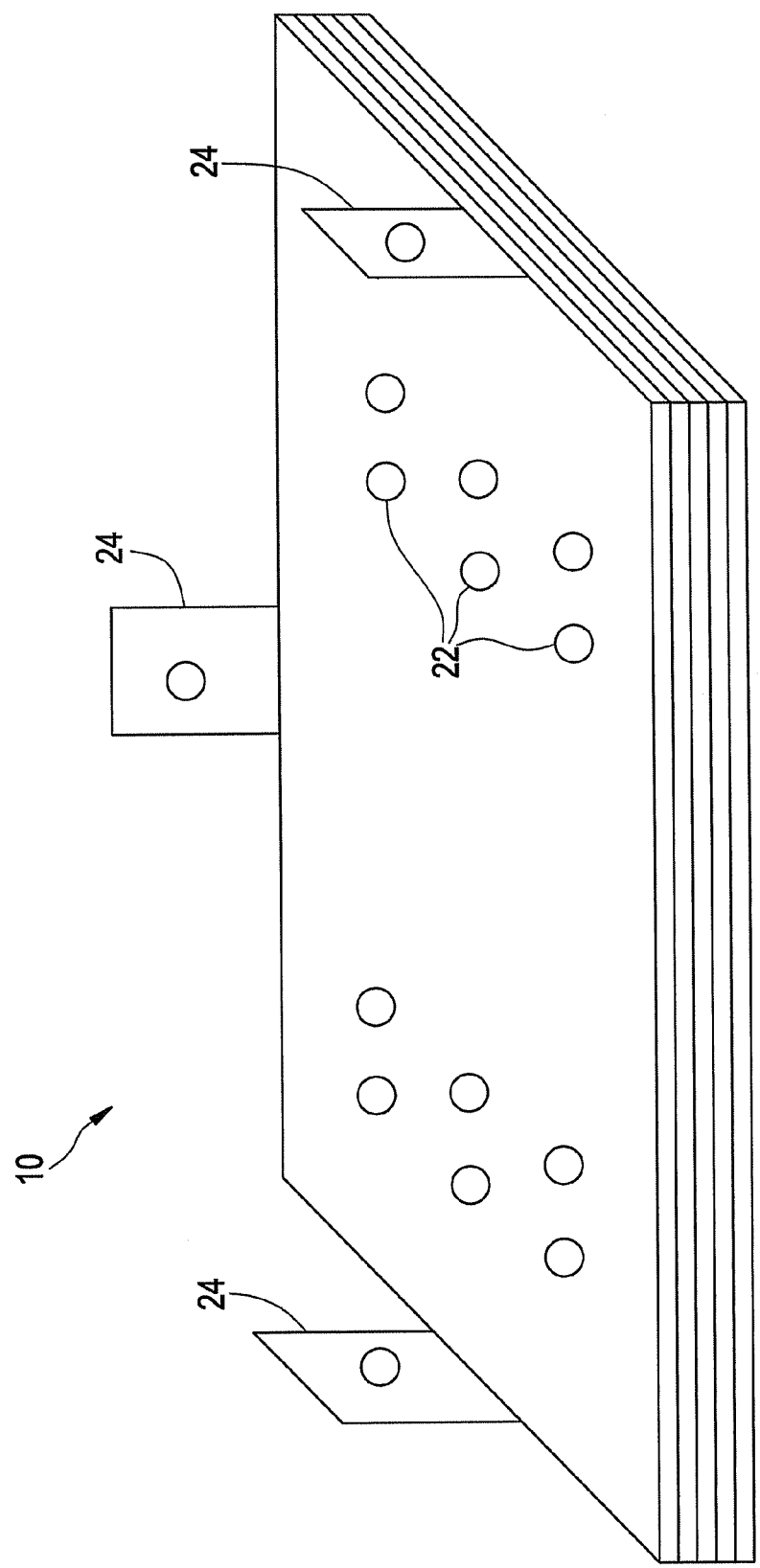

LAMINATED BUS BAR ASSEMBLY

BACKGROUND

The present disclosure relates to a bus bar assembly and more particularly, to a laminated bus bar assembly.

Laminated bus bars of the type hereinafter described are used extensively in electronic devices where it is desirable to distribute power and ground to numerous points. The laminated bus bars generally exhibit high capacitance and low inductance. Typically these bars comprise one or more elongated, flat conductors, each having a plurality of spaced, integral lugs or terminals projecting from one or both longitudinal edges thereof. The conductors are laminated between layers of dielectric insulating material, the marginal edges of which project slightly beyond, and are sealed around the outer edges of the conductors. The conductors usually are similar in configuration, although in many instances the terminals on adjacent conductors are spaced differently so as to be laterally offset from each other in the assembly, thereby minimizing the possibility of accidental shorting between conductors. The laminated bus bar may further include non-conductive outer covers for sandwiching the alternating conductors and dielectric layers.

Each conductor in the laminated bus bar assembly is a relatively thin metallic conductive material, e.g., copper (which may also be plated with a protective metal such as tin, nickel and the like) whereas each dielectric layer comprises a solid, nonporous, insulating material such as a polyester film. The conductive layers, dielectric layers, and non-conductive covers are assembled and laminated together.

Partial discharges as well as electrical failures can occur during the use of laminated bus bar assemblies. For example, exposing the laminated bus bar assembly to excessive vibration or heat changes can cause delamination to occur between layers. Delamination is undesirable and can lead to creepage effects, which in turn can cause partial discharges.

Electrical failures and partial discharges are not desired in laminated bus bar assemblies. It is desirable to have a laminated bus bar assembly that prevents electrical failures in the bus bar as well as minimizes the amount of voltage leakage attributable to partial discharges. Reducing electrical failures and partial discharges provide a significant commercial advantage.

BRIEF SUMMARY

Disclosed herein is a laminated bus bar assembly comprising alternating layers of a conductor layer and an elastic, compressible foam dielectric layer. In one embodiment, the alternating layers are sandwiched between optional non-conductive outer covers.

A method of producing the laminated bus bars comprises stacking a plurality of electrically conductive blanks and a plurality of dielectric insulator blanks in alternating relation, wherein the dielectric insulative blanks comprise an elastic, compressible non-conductive foam material; and laminating the conductive and insulative blank to form the laminated bus bar.

The above described and other features are exemplified by the following figures and detailed description.

BRIEF DESCRIPTION OF THE DRAWINGS

Referring to the exemplary drawings wherein like elements are numbered alike in the several Figures:

FIG. 1 is a cross sectional view of a laminated bus bar assembly including alternating layers of a conductive sheet and a foam dielectric sheet; and FIG. 2 is a perspective view of a bus bar assembly.

DETAILED DESCRIPTION OF THE PREFERRED EMBODIMENTS

Disclosed herein is a bus bar assembly of laminar construction useful for power distribution systems, high power transistor modules, and the like. Referring now to FIGS. 1 and 2, a laminated bus bar assembly is shown generally designated by reference numeral 10. The laminated bus bar assembly 10 is exemplary only and is not intended to be limited to any particular shape, size, configuration, number of lamina, or the like. The laminated bus bar assembly 10 generally comprises alternating layers of a conductive sheet 12 and a foam dielectric sheet 14. Preferably, the conductive sheet 12 and a foam dielectric sheet 14 are sandwiched between non-conductive outer covers 18 and 20. Also shown are optional insulating layers 16 disposed between the conductive sheet 12 and the foam dielectric sheet 14. The non-conductive outer covers 18, 20 and insulating layers 16 are also referred to as insulating foils and may be fabricated from the same or different insulative materials. As shown more clearly in FIG. 2, the laminated bus bar assembly 10 may further include internal contacts 22 as well as external connections 24 for input, output, and ground.

The conductive sheets 12 are preferably fabricated from relatively thin, flat metallic sheets of a conductive material. The conductive sheets may be cut, stamped, punched, chemically etched, or otherwise formed into the particular shape intended for the bus bar application. The stamping operation may be performed on either pre-plated stock or on bare stock. Preferably, the conductive sheet is cleaned, deburred (e.g., chemically), and plated prior to assembly. These cleaning and plating operations are well known in the art and will not be described herein. For most laminated bus bar applications, thicknesses of the conductive sheets 12 are preferably about 0.5 millimeters (mm) to about 6 mm, with about 1 mm to 5 mm preferred. Suitable conductive materials include copper, aluminum, nickel, tin, silver, brass, bronze, alloys comprising at least one of the foregoing conductive materials, or any other electrically conductive material. In a preferred embodiment, the conductive sheets 12 are fabricated from copper. The conductive sheets 12 can serve as ground planes, power signal conductors, and the like.

The conductive sheets 12 are each made to have a particular shape or outline along one longitudinal edge. The particular shape or outline of the conductive sheet 12 depends on its use. The foam dielectric sheet 14 will have a similar or substantially similar shape as the conductive sheets 12 depending on the design and intended use of the laminated bus bar assembly 10.

Optionally, the conductive sheets 12 may further include the insulation layer 16 disposed on one or more surfaces prior to assembly as previously described. The insulating layer 16 is preferably applied as an insulation foil and may be coated, affixed with an adhesive, or preferably laminated under appropriate pressure and temperature to the conductive sheet 12. For example, a conductive sheet having dimensions including a length of 12 inches, a width of 5 inches, and a thickness of ⅛ of inch may be laminated by sandwiching the conductive sheet between two insulation foils having dimensions including a length of 12¼ inches, and a width of 5¼ inches. Preferably, all of the surfaces of the conductive sheet are covered (laminated) with the insulating foil, thereby minimizing the potential for short circuits.

The insulation layer 16 is substantially non-conductive and may be fabricated from a non-conductive plastic material such as, for example, polyester, polyimide, polyvinylfluoride, polyamide, polysiloxane, and the like. Suitable insulation layers are commercially available from the Rogers Corporation. For example, part number CMD 913071 is a transparent polyester and white pigmented polyvinyl fluoride film suitable for use as an insulation layer that can be coated with an acrylic thermoplastic adhesive for application to the conductive sheet 12.

The insulation layer 16 serves to prevent electrical leakage such as, for example, an electrical leakage caused by air and creepage distance problems. Creepage distance is defined as the shortest path between two conductive parts measured along the surface of the insulation layer and air distance is defined as the shortest path between two conductive parts measured above the insulation surface. Eliminating or reducing creepage distance can improve manufacturing of high frequency power transformers and the related components such as power supplies and monitors. For example, decreasing creepage distance permits the manufacture of smaller transformers.

The foam dielectric sheets 14 electrically separate the conductive sheets 12 from one another and are preferably fabricated from a polymer, wherein a gas, such as air, is incorporated into a matrix of the polymer. While not wanting to be bound by theory, it is believed that incorporating a gas, such as air, into the polymer matrix to form the foam results in a reduced dielectric constant (i.e., lower capacitance) relative to the solid polymer material used to form the foam. Moreover, the foam dielectric provides other advantageous properties not available with solid type dielectrics, which will be described in greater detail below.

As used herein, the term "dielectric" refers to a physical property (K) of an insulating material that is the ratio of the parallel capacitance of a given configuration of electrodes with the material as the dielectric to the capacitance of the same electrode configuration with a vacuum as the dielectric. The dielectric constant of the foam dielectric sheet 14 can vary by simply increasing or decreasing the level of porosity within the polymer matrix, i.e., density. The particular dielectric constant employed will depend on the intended use and design of the laminated bus bar assembly 10. Preferably, the foam dielectric sheet 14 has a dielectric constant less than about 1.58 as measured in accordance with ASTM D-149 procedures, with less than or equal to about 1.42 more preferred, and with less than or equal to about 1.34 even more preferred.

Polymers suitable for fabricating the foam dielectric sheet 14 include polyurethanes, polysilicones, polyacrylics, polyethylenes, polyesters, and the like. In a preferred embodiment, the foam dielectric sheet is fabricated from polyurethane or polysilicone. Suitable polyurethane foams include those commercially available under the trademark PORON from the Rogers Corporation. Suitable silicone foams include those commercially available under the trademark BISCO from the Rogers Corporation.

The thickness of the foam dielectric sheet 14 can be about 0.8 millimeters (mm) to about 25.4 mm, with about 1.6 mm to 6.4 mm preferred, and with about 2.2 mm to about 2.4 more preferred. In most applications, the thickness of the foam dielectric sheet 14 is about equal to or less than the thickness of the conductive sheet 12.

The density of the foam dielectric sheet is preferably less than or equal to about 300 kilograms per cubic meter ($kg/m^3$), with less than or equal to 250 $kg/m^3$ more preferred, and with less than or equal to 190 $kg/m^3$ even more preferred. Generally, a foam dielectric sheet having a greater amount of gas incorporated into the polymer matrix, results in a lower density sheet and a lower dielectric constant. Advantageously, the use of a lower dielectric constant material permits the designer of the laminated bus bar assembly 10 to use relatively thinner thicknesses for the dielectric layer 14.

The compression set at 70° C. for the foam dielectric sheet 14 is preferably less than about 1 percent as measured in accordance with ASTM D-1056. The compression force deflection at 25% deflection (ASTM D-1056) is preferably about 1.0 pounds per square inch (psi), with about 1.5 psi to about 10.0 psi preferred, and with about 2.0 psi to about 3.5 psi even more preferred. The compressibility of the foam dielectric sheet 14 is believed to provide structural integrity to the bus bar assembly 10 in environments where the laminated bus bar assembly 10 is exposed to vibration and heat changes. It has advantageously been found that vibrational forces exerted on the laminated bus bar assembly 10 are absorbed and dissipated due to the compressive nature of the foam dielectric material in all directions. As a result, the operating lifetimes of the laminated bus bar assembly is improved in these types of environments since the potential for delamination caused by vibration is minimized or eliminated.

The outer covers 18, 20, the alternating layers of conductive and dielectric foam sheets 12, 14, respectively, and the insulating layer 16, if present, are assembled into a unitary structure and preferably fixed in place by any suitable means such as by lamination, by adhesive, by mechanical fasteners such as an FR4 fabricated bolt, or the like.

In the case of lamination, one or both major surfaces of the insulating sheet 16 (disposed on surfaces of the conductive layer 12) and/or foam dielectric sheet 14 will have first been coated with a thermoplastic adhesive material and/or thermo-hardened adhesive material. The assembled layers are then subjected to heat and pressure in order to activate the thermoplastic or thermo-hardened adhesive material disposed on the conductive sheet 12 or the dielectric foam sheet 14. A lamination cycle preferably comprises application of a pressure of about 25 to about 200 pounds per square inch (psi) for about 0.1 to about 5 minutes and a temperature of about 100° F. to about 500° F. followed by a continued application of pressure for about 0.1 to about 5 minutes after removal of heat. More preferably, the lamination cycle comprises application of pressure of about 75 to about 150 psi for about 1 to about 2 minutes and a temperature of about 250° F. to about 350° F. followed by a continued application of pressure for about 1 to about 2 minutes after removal of heat. The structure 10 resulting from the lamination step is shown more clearly in cross section in FIG. 1.

At this stage, the laminated bus bar assembly 10 is complete except for providing the necessary external connections for input, output and ground.

In a preferred example of a laminated bus bar assembly 10, conductive sheets 12 were formed of copper and coated with an insulation layer (foil) 16 comprising a polyester film, while the foam dielectric sheets 16 were a polyurethane foam or silicone foam sheet with a dry thermoplastic or thermo-hardener adhesive coated onto each face of the dielectric prior to lamination.

The use of a foam dielectric sheet within a laminated bus bar assembly provides numerous advantages. The use of thin foam dielectrics and the flat laminar construction results in a laminated bus bar assembly exhibiting high capacitance and low inductance, and as such, results in a very low characteristic impedance. Improved vibration resistance is achieved due to the elastic and compressible nature of the foam material. The use of a foam dielectric minimizes stress due to coefficient of thermal expansion mismatches between the foam dielectric material, bus bars, and bushings. Moreover, a lower dielectric constant provided by the foam sheet relative to solid dielectric sheets allows the use of thinner insulating layers in the bus bar. Additionally, the use of the foam dielectric has been found to advantageously increase partial discharge voltage levels by up to about 50%. Advantageously, the foam dielectric sheet material 14 is punchable, drillable, laminable, and highly reliable.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A laminated bus bar assembly consisting essentially of: alternating layers of a conductor layer and an elastic, compressible foam dielectric layer; and an insulating foil fixedly attached to a surface of the conductor layer, and internal contacts and external connections for an input, an output, and a ground, wherein the conductor layer consists of a metal selected from a group consisting of copper, aluminum, nickel, tin, silver, brass, bronze, and alloys of two or more of the foregoing metals, wherein the laminated bus bar assembly is a power distribution device.

2. The laminated bus bar assembly of claim 1, wherein the foam dielectric layer comprises a material selected from the group consisting of polyurethanes, polysilicones, polyacrylics, polyethylenes, and polyesters.

3. The laminated bus bar assembly of claim 1, wherein the foam dielectric layer comprises a polyurethane material.

4. The laminated bus bar assembly of claim 1, wherein the foam dielectric layer comprises a polysilicone material.

5. The laminated bus bar assembly of claim 1, wherein the foam dielectric layer and the conductor layer have a thickness of about 2.2 to about 2.4 millimeters.

6. The laminated bus bar assembly of claim 1, wherein the foam dielectric layer and the conductor layer are about the same thickness.

7. The laminated bus bar assembly of claim 1, wherein the foam dielectric layer has a dielectric constant greater than a non-porous dielectric layer of the same material.

8. The laminated bus bar assembly of claim 1, wherein the foam dielectric layer has a dielectric constant less than about 1.58.

9. The laminated bus bar assembly of claim 1, wherein the foam dielectric layer has a dielectric constant less than about 1.42.

10. The laminated bus bar assembly of claim 1, wherein the foam dielectric layer has a dielectric constant less than about 1.34.

11. The laminated bus bar assembly of claim 1, wherein the foam dielectric layer has a density less than about 300 kilograms per cubic meter.

12. The laminated bus bar assembly of claim 1, wherein the foam dielectric layer has a density less than about 250 kilograms per cubic meter.

13. The laminated bus bar assembly of claim 1, wherein the foam dielectric layer has a density less than about 190 kilograms per cubic meter.

14. The laminated bus bar assembly of claim 1, wherein the foam dielectric layer has a compression force deflection of about 1.0 to about 24.0 pounds per square inch.

15. The laminated bus bar assembly of claim 1, wherein the foam dielectric layer has a compression force deflection of about 1.5 to about 10.0 pounds per square inch.

16. The laminated bus bar assembly of claim 1, wherein the foam dielectric layer has a compression force deflection of about 2.0 to about 3.5 pounds per square inch.

17. The laminated bus bar assembly of claim 1, wherein the foam dielectric layer and the conductive layer have a thickness of about 1.0 to about 25.4 millimeters.

18. The laminated bus bar assembly of claim 1, wherein the foam dielectric layer and the conductive layer have a thickness of about 1.5 to about 10.0 millimeters.

19. A method of producing laminated bus bars comprising stacking a plurality of electrically conductive blanks and a plurality of flat, dielectric insulator blanks in alternating relation with an insulating foil disposed between the electrically conductive blank and the dielectric insulator blank, wherein the dielectric insulator blanks consist essentially of a non-conductive elastic, compressible foam material and wherein the electrically conductive blanks consist of a metal selected from a group consisting of copper, aluminum, nickel, tin, silver, brass, bronze, and alloys comprising two or more of the foregoing metals;

laminating the conductive and insulative blanks and insulating foil; and forming internal contacts and external connections for an input, an output, and a ground to produce the laminated bus bars, wherein the laminated bus bar is a power distribution device.

20. A laminated bus bar assembly, consisting essentially of:
a top cover comprising a non-conductive material;
a bottom cover comprising a non-conductive material;
alternating layers of a conductor layer and an elastic, compressible foam dielectric layer sandwiched between the top and bottom covers and an insulating foil fixedly attached to a surface of the conductor layer,; and
internal contacts and external connections for an input, an output, and a ground, wherein the conductor layer consists of a metal selected from a group consisting of copper, aluminum, nickel, tin, silver, brass, bronze, and alloys of two or more of the foregoing metals, wherein the laminated bus bar assembly is a power distribution device.

* * * * *

UNITED STATES PATENT AND TRADEMARK OFFICE
CERTIFICATE OF CORRECTION

PATENT NO. : 7,557,298 B2  Page 1 of 1
APPLICATION NO. : 10/269223
DATED : July 7, 2009
INVENTOR(S) : Carl Vanhoutte et al.

It is certified that error appears in the above-identified patent and that said Letters Patent is hereby corrected as shown below:

Title Page, Item (57) Abstract should read
-- Abstract
A laminated bus bar assembly comprises alternating layers of a conductive layer and a foam dielectric layer. The foam dielectric layer has a dielectric constant ~~greater~~ lower than a solid non-porous dielectric constant of the same material, the use of which increases the partial discharge inception and extinction voltage levels, provides vibration resistance, decreases inductance and the like. The bus bar assembly of laminar construction is useful for power distribution systems, high power transistor modules, and the like. --.

Signed and Sealed this

Twenty-second Day of December, 2009

David J. Kappos
*Director of the United States Patent and Trademark Office*